(12) United States Patent
Heymann

(10) Patent No.: US 7,365,606 B2
(45) Date of Patent: Apr. 29, 2008

(54) RECEIVING AMPLIFIER, IN PARTICULAR FOR TELEVISION RECEIVERS, AND USE OF THE RECEIVING AMPLIFIER

(75) Inventor: Roland Heymann, Sauerlach (DE)

(73) Assignee: Infineon Technologies AG, Munich (DE)

( * ) Notice: Subject to any disclaimer, the term of this patent is extended or adjusted under 35 U.S.C. 154(b) by 96 days.

(21) Appl. No.: 11/445,646

(22) Filed: Jun. 2, 2006

(65) Prior Publication Data

US 2006/0290430 A1    Dec. 28, 2006

(30) Foreign Application Priority Data

Jun. 3, 2005    (DE) .................... 10 2005 025 677

(51) Int. Cl.
*H03F 3/04* (2006.01)
(52) U.S. Cl. .................. 330/305; 330/307; 330/124 R
(58) Field of Classification Search ................ 330/305, 330/307, 124 R
See application file for complete search history.

(56) References Cited

U.S. PATENT DOCUMENTS

| | | | |
|---|---|---|---|
| 3,886,469 A * | 5/1975 | Rollett et al. ................ 330/107 |
| 4,862,121 A * | 8/1989 | Hochschild et al. ......... 333/173 |
| 5,389,778 A * | 2/1995 | Shinomiya .............. 250/214 R |
| 6,342,813 B1 | 1/2002 | Imbornone et al. | |
| 6,573,788 B2 * | 6/2003 | Oppelt ..................... 330/61 A |
| 6,882,226 B2 * | 4/2005 | Cho et al. .................... 330/282 |
| 7,256,646 B2 * | 8/2007 | Eid et al. .................... 327/563 |

* cited by examiner

*Primary Examiner*—Patricia Nguyen
(74) *Attorney, Agent, or Firm*—Eschweiler & Associates, LLC

(57) ABSTRACT

A receiving amplifier includes a semiconductor body with a first node, a second node and an amplifier circuit. The amplifier includes at least one field-effect transistor, a first input, and a second input. A capacitive element is arranged between the inputs of the amplifier circuit, and a tuned circuit whose resonant frequency can be tuned is connected upstream of the amplifier circuit and contains a variable-capacitance element that is connected in parallel with the element in the amplifier circuit. Two inductive elements are also provided, wherein the first inductive element is connected to the first node and the second inductive element is connected to the second node. This results in a series tuned circuit, which leads to a voltage increase at the resonant frequency, and results in an improved signal-to-noise ratio for a signal which is supplied to the receiving amplifier.

14 Claims, 5 Drawing Sheets

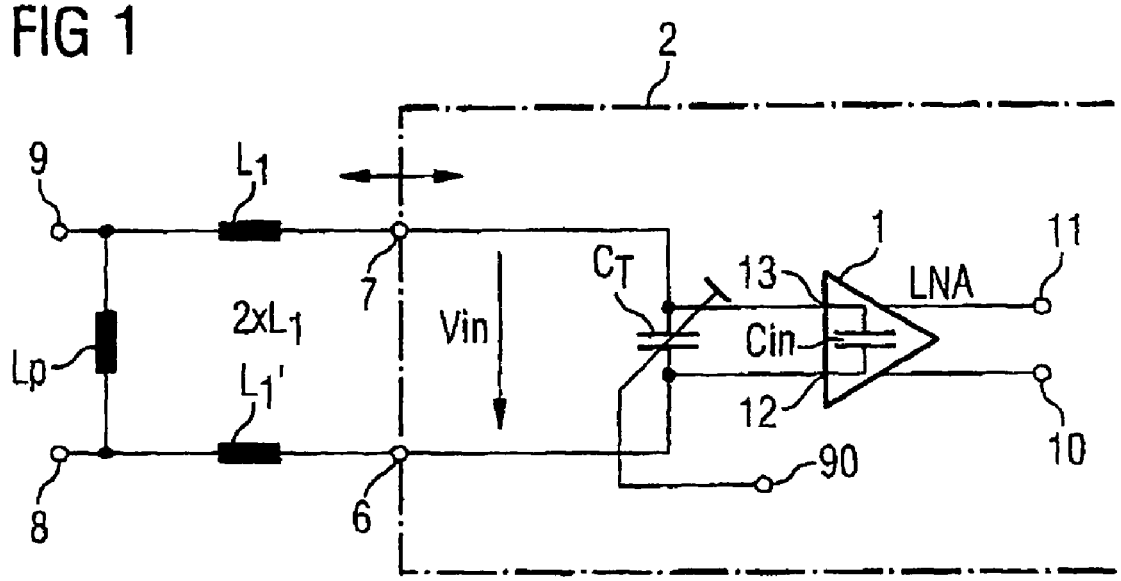
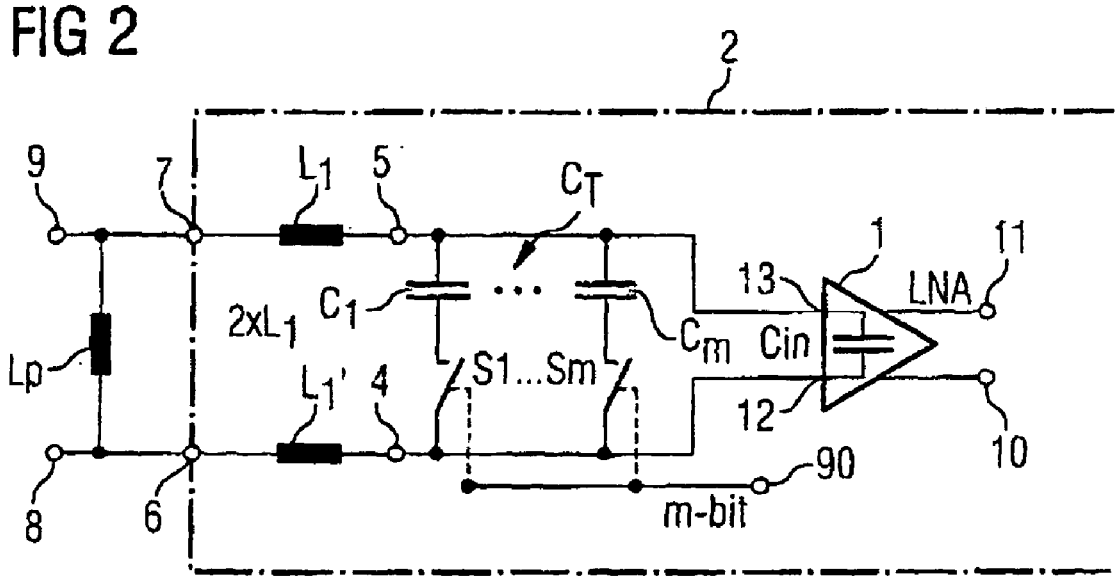

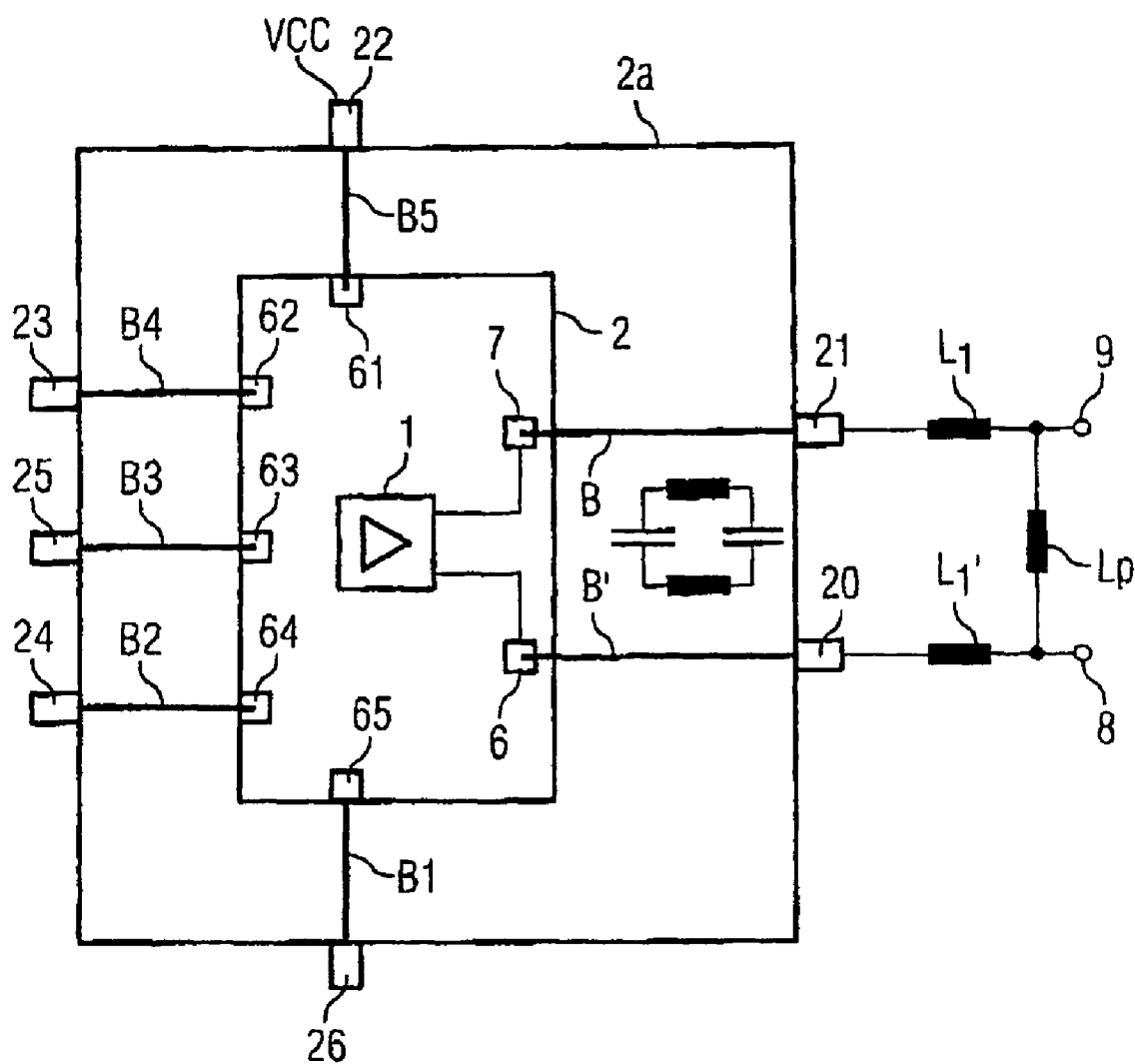

RECEIVING AMPLIFIER, IN PARTICULAR FOR TELEVISION RECEIVERS, AND USE OF THE RECEIVING AMPLIFIER

REFERENCE TO RELATED APPLICATIONS

This application claims the benefit of the priority date of German application DE 10 2005 025 677.5, filed on Jun. 3, 2005, the contents of which are herein incorporated by reference in their entirety.

FIELD OF THE INVENTION

The invention relates to a receiving amplifier, in particular for the processing of communication signals such as television signals. The invention also relates to the use of a receiving amplifier such as this.

BACKGROUND OF THE INVENTION

Modern wire-free data transmission systems are subject to ever more stringent requirements for the sensitivity of receiving amplifiers. On the one hand, this is because the transmission signal field strength is becoming ever lower in order to prevent interference in the adjacent channels, and thus interference with other mobile data transmission systems. On the other hand, the amount of information transmitted is becoming ever greater. This leads on the one hand to spectral broadening of the transmitted signal, that is to say a wider bandwidth is required for the transmitted signal. One typical example of a broadband mobile radio standard is the 802.11a or 802.11b (W-LAN) Standard, whose signals have a bandwidth of about 20 MHz at a carrier frequency of 2.4 or 5.2 GHz, respectively. Data transmission methods for digital television (digital video broadcast, terrestrial, DVB-T, digital video broadcast, satellite, DVB-S) use even wider bandwidths of several hundred Megahertz.

On the other hand, the modulation methods are becoming considerably more complex, and of higher quality. While, by way of example, the FSK (frequency shift keying) modulation method is used for the GSM mobile radio standard, and is relatively insensitive to amplitude and phase fluctuations, the 802.11a, 11b mobile radio standards and the DVB-T television standard use a so-called OFDM (orthogonal frequency-division multiplexing) modulation method. These Standards have a highly sensitive reaction to noise components in the received signal.

The noise in the received signal originates on the one hand from noise components in the frequency band of the received signal. This component is caused, for example, by atmospheric interference or by interference from other transmitted signals. On the other hand, the noise also contains a component which is caused by the receiving components that are used. For example, in principle, every active and passive component in the receiving chain of a receiver has a certain amount of self-noise. The components in the receiving chain, and in this case in particular the receiving amplifiers, add a noise component of their self-noise to the received signal, and thus change the ratio of the useful signal to the undesirable noise signal. One characteristic variable for components which indicates the component of the noise produced by the components is the noise factor. This is defined as the quotient of the signal-to-noise ratio of a signal at the input of the component, and the signal-to-noise ratio at the output of the element.

For receivers, it is necessary particularly for the first amplifier contained in the receiving chain to have a particularly low noise factor, and thus to add only a small amount of noise to the received signal. Furthermore, the receiving amplifier should have sufficiently good sensitivity over a wide bandwidth.

In order to solve this problem, some receiving amplifiers have an external "tracking filter" connected upstream of them, which essentially represents a tracking bandpass filter. This suppresses the undesirable spectral components outside the useful signal bandwidth. Some of the noise is also suppressed in this case. However, a tracking filter such as this has the disadvantage that the element which governs the frequency, for example a varactor diode, must be supplied with an adjustment voltage which is derived from a voltage controlled oscillator that is used in the receiving unit. This leads to high costs and to a large amount of space being consumed, as well as a complex subsequent calibration routine.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to a receiving amplifier which has the advantages of a narrowband system over a broad frequency range. The aim in this case is in particular to achieve a good noise factor, high gain and adequate suppression of the intermodulation products and secondary frequency bands.

The invention, in one embodiment, comprises a particularly low-noise amplifier circuit and a tunable component which governs the frequency in the form of an integrated circuit in a semiconductor body in a receiving amplifier.

In one embodiment, the receiving amplifier comprises a first input connection and a semiconductor body with a first node and at least one second node. An amplifier circuit is integrated in the semiconductor body and has at least one transistor, a first input, a second input and a capacitive element arranged between the first input and the second input. In order to improve the noise factor of the integrated amplifier circuit, a tuned circuit whose resonant frequency can be tuned is provided. This comprises, in one example, a variable-capacitance element which is integrated in the semiconductor body and has a control input. Its connections are connected between the first and the second node, and in parallel with the capacitive element in the integrated amplifier circuit. Furthermore, at least one first inductive element is provided. The first inductive element is connected by a first connection to the first node, and by a second connection to the first input connection.

In one embodiment, the tuned circuit whose resonant frequency can be tuned is formed partially within the semiconductor body. In particular, the variable-capacitance element which governs the frequency is formed within the semiconductor body, thus allowing a considerably simpler calibration routine.

Further adaptations can likewise be carried out considerably more easily with respect to achieving an integrated amplifier circuit with optimum gain. The tuned circuit whose resonant frequency can be tuned leads to a considerable voltage peak, and thus to an improved signal-to-noise ratio, in the region of the resonant frequency. At the same time, the tunable tuned circuit acts as a tracking filter and suppresses signal components outside the useful signal band, which is selected by means of the resonant frequency.

The capacitive element which is arranged within the integrated amplifier circuit in one embodiment is also part of the resonant structure. In particular, it is connected in parallel with the variable-capacitance element. The active use of the capacitive element arranged in the amplifier circuit as part of the tunable tuned circuit makes it possible to correct for parasitic capacitive elements within the amplifier circuit, or advantageously to also use them for formation of the tuned circuit.

In a further embodiment of the invention, the receiving amplifier comprises a second input connection. The tuned circuit whose resonance can be tuned furthermore contains a second inductive element, whose first connection is coupled to the second node, and whose second connection is coupled to the second input connection. This results in a balanced tuned circuit design which improves the resonance response.

In a further embodiment, the transistor in the integrated amplifier circuit may be in the form of a field-effect transistor.

The receiving amplifier according to one embodiment of the invention can be used to receive signals which are distributed over a wide frequency range. According to the invention, the resonant frequency of the tunable tuned circuit is in this case tuned to the desired frequency, and thus to the frequency range of the signal to be received. At the same time, the tuned circuit makes it possible to achieve adequate suppression of signals outside the desired frequency band.

A further embodiment of the invention relates to the embodiment in a semiconductor body. The first node can thus form a first contact point, and the second node can form a second contact point on the surface of the semiconductor body. In this embodiment, the first and the second inductive element are arranged outside the semiconductor body. It is possible to connect a third inductive element between the first input connection and the second input connection, which is thus arranged in parallel with the variable-capacitance element. The third inductive element and the variable-capacitance element in this embodiment form a parallel tuned circuit.

In one embodiment of the invention, the variable-capacitance element has at least one varactor diode, whose capacitance can be adjusted variably by means of a control signal at the control input of the variable element. In this embodiment, a change in the resonant frequency is accordingly achieved by variable adjustment of the capacitance of the varactor diode.

In another embodiment of the invention, the variable-capacitance element comprising a plurality of charge storage devices arranged in parallel. These are each connected by a first connection to the first contact point, and by a second connection to the second contact point, in each case via a switching apparatus which can be driven by a signal at the control input. In this embodiment, the capacitance of the element can be adjusted in discrete values via a signal at the control input. The resonant frequency of the tunable tuned circuit can thus be varied in discrete-value steps.

One embodiment of the variable-capacitance element can also be implemented by a combination of variably adjustable elements and elements which can be adjusted in discrete values.

In one embodiment, the capacitances each have the same value in a plurality of charge storage devices which are arranged in parallel. In an alternative embodiment, the values of the capacitances of at least two of the charge storage devices which are arranged in parallel differ by a factor of two. In one corresponding embodiment, the plurality of charge storage devices which are arranged in parallel have binary weightings.

In another embodiment of the invention, the amplifier circuit comprises a differential amplifier with a first and a second field-effect transistor. The gate connections of the two field-effect transistors form the first and the second input of the integrated amplifier circuit. In one embodiment, the capacitive element in the amplifier circuit comprises the gate-drain capacitance of the first and of the second field-effect transistor, or the gate-source capacitance of the first and of the second field-effect transistor. In this embodiment, parasitic effects, in particular the gate-drain and gate-source capacitances of the field-effect transistors which are used in the amplifier circuit, are also used for the tuned circuit whose resonant frequency can be tuned. This makes it possible to advantageously achieve improved matching to the input impedance of the amplifier circuit. The signal-to-noise ratio is improved, and the noise factor is reduced.

In a further embodiment of the invention, the receiving amplifier comprises a housing surrounding the semiconductor body with connecting pads on the surface of the housing. Connecting means are provided, which couple the connecting pads on the housing to the connecting contacts on the surface of the semiconductor body, and have a bandstop characteristic. This therefore advantageously results, via the connecting means, in an additional improvement in the suppression of undesirable frequency components. In particular, a suitable arrangement of the connecting means can be used to provide bandstops in frequency ranges which are normally used by undesirable signal components. The connecting means expediently comprise bonding wires, solder balls or bumps.

To the accomplishment of the foregoing and related ends, the invention comprises the features hereinafter fully described and particularly pointed out in the claims. The following description and the annexed drawings set forth-in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in detail in the following text with reference to the drawings, in which:

FIG. 1 is a schematic diagram illustrating a first exemplary embodiment of the invention, FIG. 2 is a schematic diagram illustrating a second exemplary embodiment of the invention, FIG. 7 is a plan view illustrating the exemplary embodiment shown in FIG. 6, and FIGS. 8A and 8B are graphs illustrating the noise factor and the frequency response over the frequency, based on the exemplary embodiment of FIG. 3.

DETAILED DESCRIPTION OF THE INVENTION

Figure 3:
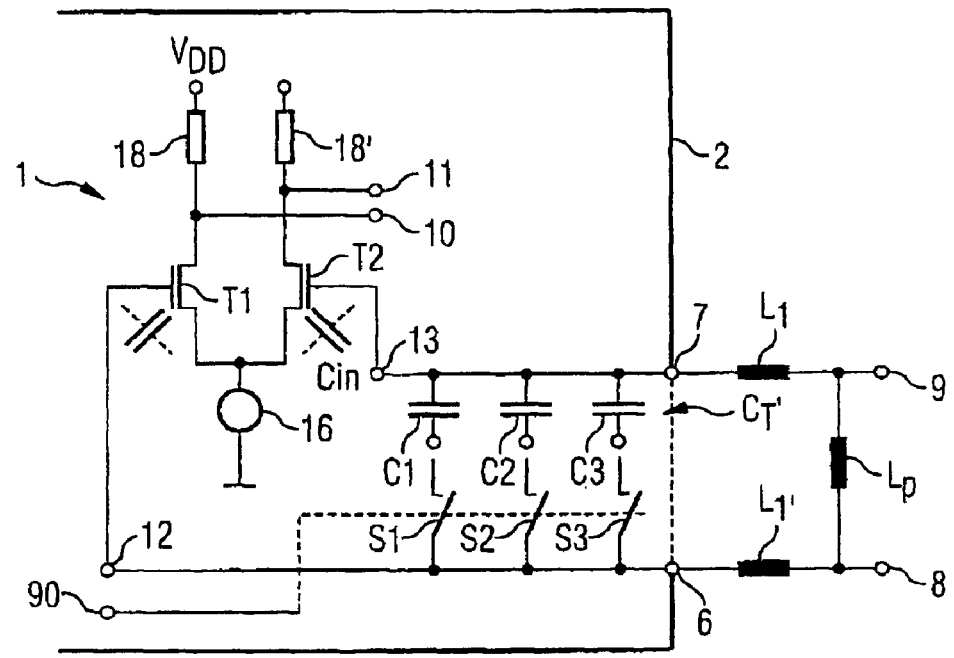
FIG. 3 is a schematic diagram illustrating a third exemplary embodiment of the invention.

FIG. 1 shows a first exemplary embodiment of the invention. The receiving amplifier comprises a semiconductor body 2. The semiconductor body 2 includes a plurality of contact points on its surface, two of which are illustrated here, the contact points 6 and 7. These form connecting contacts for the components which are integrated in the semiconductor body 2.

A low-noise amplifier 1 in the form of an integrated circuit is formed in the semiconductor body 2. The integrated amplifier circuit 1 comprises a first input 12, a second input 13 and output taps 10 and 11. The integrated amplifier circuit 1 also includes a capacitive element Cin, which is connected to the input connections 12 and 13. The capacitive element Cin is in the form of a capacitor or charge storage device. In this example, it comprises both parasitic capacitances which are connected in parallel between the input connections 12 and 13 and, possibly, a desired input capacitance, for example for also matching the input connection impedances for the rest of the signal processing chain for the low-noise amplifier 1.

The input connection 12 is connected to a first connection of a variable-capacitance element $C_T$. The second input connection 13 of the low-noise amplifier 1 is connected to the second connection of the variable-capacitance element $C_T$. The variable-capacitance element $C_T$ in this exemplary embodiment comprises a varactor diode. The varactor diode has a control input 90 for supplying a control signal for capacitance adjustment.

Furthermore, the two input connections 12 and 13 of the low-noise amplifier 1 are connected to the respective contact points 6 and 7 on the surface of the semiconductor body. The contact points are themselves connected to two inductive elements, in this case in the form of coils $L_1$ and $L_1'$. A further coil Lp is connected between the coils $L_1$ and $L_1'$. As can be seen in FIG. 1, this is arranged in parallel with the variable-capacitance element $C_T$. The connections of the coil Lp at the same time form the first input 8 and the second input 9 of the receiving amplifier according to the invention.

The variable capacitance $C_T$ in the form of the varactor diode as well as the two coils $L_1$ and $L_1'$ form a series tuned circuit with a resonant frequency which can be adjusted via the capacitance of the diode. In addition, the coil Lp and the capacitive element Cin which is arranged in parallel with the varactor diode $C_T$ in the low-noise amplifier 1 influence the frequency of the tuned circuit. The tuned circuit comprising the inductances of the coils $L_1$, $L_1'$ and Lp, and the capacitance of the element Cin, has a resonant frequency which can be tuned by means of the varactor diode $C_T$. A voltage Vin can be tapped off across the varactor diode $C_T$. At the resonant frequency, voltage Vin is highly pronounced, and thus leads to a very good signal-to-noise ratio across the varactor diode $C_T$. The voltage Vin is then applied in an increased form to the input connections of the low-noise amplifier 1.

The increase resulting from the resonant response of the series tuned circuit leads to a higher signal level at the inputs of the low-noise amplifier 1. This improves the noise factor which maps the quotient of the signal-to-noise ratios at the input and at the output of the low-noise amplifier 1.

The tuned circuit also provides matching for the input impedance of the low-noise amplifier. In particular, the tuning capability has the advantage of allowing matching over the entire frequency range that is of interest. The implementation of the variable resonant-frequency element within the semiconductor body simplifies calibration, and speeds up processes such as a change in the receiving channel to a new frequency.

This fact is particularly useful for receiving amplifiers which have to cover a very wide frequency range. Examples of the use are receiving amplifiers for digital television, for example for the DVB-T (digital video broadcast, terrestrial) or DVB-S (digital video broadcast, satellite) television standard. With these standards, the data is transmitted on the one hand using OFDM modulation methods, which have a highly sensitive reaction to a poor signal-to-noise ratio, and on the other hand by QPSK (quadrature phase shift keying) or QAM (quadrature amplitude modulation) modulation methods. In this case, the signal-to-noise ratio is improved by the voltage increase resulting at the resonant frequency.

Furthermore, the behavior of the low-noise amplifier can be optimally set to the transmission bandwidth for a television channel. On changing from a first television channel to a second television channel, appropriate adaptation of the resonant frequency of the tuned circuit is carried out by variation of the capacitive element $C_T$. This makes it possible to use a low-noise amplifier which has very good characteristic properties only in a relatively narrow frequency range of a television channel over a broad bandwidth by variation of the resonant frequency of the upstream matching network.

FIG. 2 shows an alternative embodiment of the invention. Components having the same effect and/or function have the same reference symbols.

In this embodiment, the variable-capacitance element $C_T$ is formed by a large number of capacitors C1 to $C_m$ arranged in parallel. A first connection of the capacitors C1 to $C_m$ is connected to the second input connection 13 of the low-noise amplifier 1, and to a second node 5. The respective second connection of the capacitors C1 to $C_m$ is connected via a respective switch S1 to Sm to the first input connection 12 of the low-noise amplifier 1, and to a first node 4. The switches S1 to Sm are driven by m bits via a digital control signal at the control input 90. The switches S1 to Sm are opened and closed as a function of this control signal, and thus connect the respective capacitor C1 to $C_m$ in parallel with the input connections 12 and 13, or with the nodes 4 and 5. In this example embodiment, the capacitors all have the same capacitance, however, capacitors with differing capacitance values may be employed.

The coil $L_1$ is arranged on the surface between the node 4 and the connecting contact 6. The coil $L_1'$ is connected between the node 5 and the connecting contact 7 on the surface of the semiconductor body 2. The two coils are, in the present example, in the form of integrated components within the semiconductor body 2. The connecting contacts 6 and 7 are coupled to one another via the externally arranged coil Lp. Furthermore, they lead to the input connections 8 and 9 of the receiving amplifier according to the invention.

FIG. 3 shows a further embodiment of the invention. The two coils $L_1$ and $L_1'$ are in this example in the form of external coils outside the semiconductor body 2. In this embodiment, the low-noise amplifier 1 comprises a differential amplifier using MOS (metal-oxide semiconductor) technology, and comprises two field-effect transistors T1, T2, whose drain connections are jointly connected to a current source 16. The source connections are connected to a supply potential $V_{DD}$ via a respective resistor 18, 18'. Taps are provided between the source connections of the two field-effect transistors T1, T2 and the two resistors 18, 18', and form the outputs 10 and 11 of the low-noise amplifier 1.

The variable-capacitance element $C_T$ is formed from three capacitors $C_1$, $C_2$ and $C_3$ arranged in parallel. One connection of each of the capacitors $C_1$, $C_2$ and $C_3$ is connected to the second input connection 13 and to the second connecting contact 7 on the surface of the semiconductor body 2. The second connection of the capacitor $C_1$ is connected via a first switch S1 to the first input connection 12 of the low-noise amplifier 1, and to the first connecting contact 6. In a corresponding manner, the switches S2 and S3 couple the respective second connections of the capacitors $C_2$ and $C_3$ to the connecting contact 6 and to the first input connection 12.

The capacitances of the two capacitors $C_1$ and $C_2$, or $C_2$ and $C_3$, in one example, each differ by a factor of 2. For example, the capacitor $C_1$ is twice as large as the capacitor $C_2$. The capacitors $C_1$ to $C_3$ accordingly have binary weightings and can be driven appropriately by means of a corresponding binary control signal at the control input 90, via the switches S1 to S3.

In addition, a small parasitic capacitance is formed between the gate of the transistor T1 and its drain connection during operating of the low-noise amplifier. A gate-drain capacitance such as this also exists for the second field-effect transistor T2 in the differential amplifier. These parasitic capacitances are represented by the capacitors shown by dashed lines. The parasitic gate-drain capacitance forms the capacitive element Cin which is arranged in the amplifier circuit, and represents a part of the tuned circuit. In consequence, the parasitic capacitance is also used for matching and for production of the resonant frequency. The resonant frequency itself can be adjusted in discrete-value steps by the control signal at the control input 90. The maximum resonant frequency is predetermined by the parasitic capacitances in the differential amplifier.

In addition to the gate-drain capacitance, the gate-source capacitance of the field-effect transistors can also be used as part of the tuned circuit if the differential amplifier is suitably designed, for example by interchanging the charge-carrier type of the field-effect transistors T1 and T2 and correspondingly interchanging the polarity of the current source 16 and of the supply potential $V_{DD}$.

Figure 4:
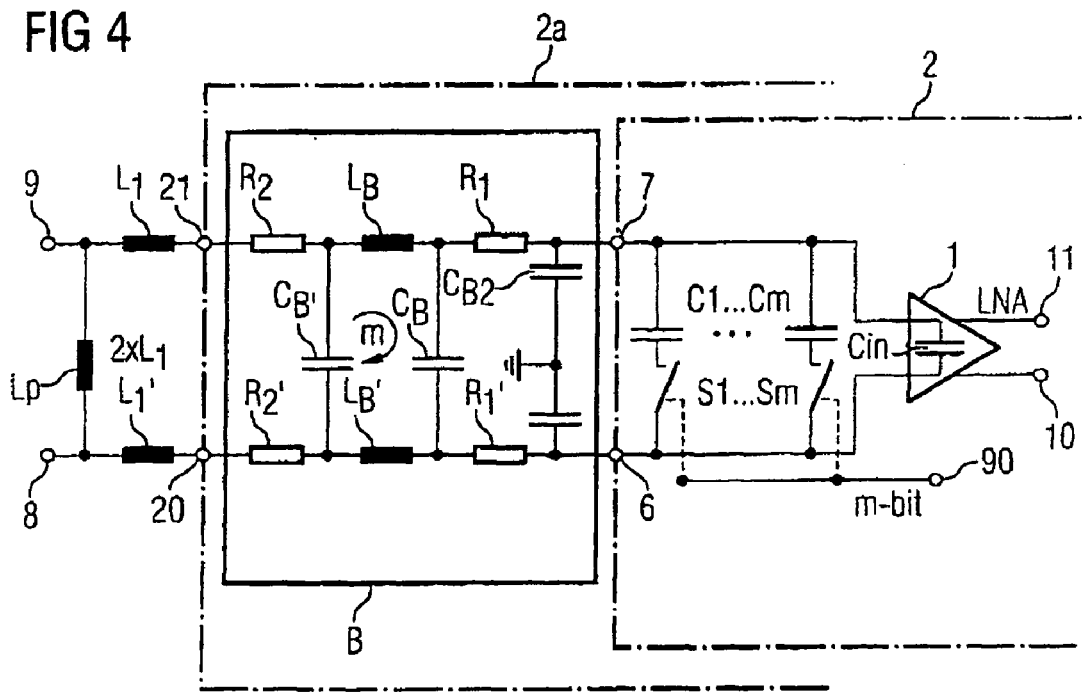
FIG. 4 is a schematic diagram illustrating a fourth exemplary embodiment of the invention.

FIG. 4 shows a further embodiment of the invention. In this case, the semiconductor body 2 is integrated within a plastic housing 2a. The plastic housing 2a itself has connecting pads 20 and 21, which are connected to the respective coils $L_1$' and $L_1$. Connecting means in the form of bonding wires are provided on the surface of the semiconductor body 2, with corresponding connecting pads 20 and 21 being provided in the housing 2a, in order to make contact with the connecting contacts 6 and 7. The circuitry and signaling characteristics of the bonding wires can be represented in an equivalent circuit B. For example, the bonding wire between the connecting contact 6 and the connecting pad 20 has a resistance $R_1$', an inductance $L_B$' and a second resistance $R_2$'. In other words, the bonding wire can also be represented by a corresponding series circuit comprising the two resistances $R_1$', $R_2$' and a coil whose inductance is $L_B$'. In a corresponding manner, the connecting means between the connecting contact 7 and the connecting pad 21 is formed by a series circuit comprising the two resistances $R_1$ and $R_2$, and an inductance $L_B$.

There is an additional capacitive relationship between the two bonding wires, because of the spatial arrangement, and this can be represented, as shown here, by two capacitances. The capacitances $C_{B2}$ are parasitic capacitances which, by way of example, result from the spatial extent of the contact points 6 and 7 on the surface of the semiconductor body. The illustrated arrangement comprising the coils $L_B$, $L_B$' and the capacitances $C_B$ and $C_B$' form a bandstop filter for signals at specific frequencies.

A bandstop filter with a well-defined frequency band can be achieved by suitable configuration of the connecting means between the connecting contacts 6 and 7 and the connecting pads 20 and 21. This makes it possible to specifically suppress signal components which are associated with different mobile radio standards. In the case of a receiving amplifier for digital terrestrial television (DVB-T), it is expedient to use additional filters to suppress the frequency range from 870 MHz to 950 MHz. This is important because the GSM900 mobile radio standard uses this frequency range.

FIG. 7 shows the top view of a semiconductor body 2 located in a housing 2a, according to the embodiment in FIG. 4. The connecting pads 20 and 21 on the outside of the housing 2a are in turn connected to the respective coils $L_1$' and $L_1$. A bonding wire B' leads from the connecting pads 20 to a connecting contact 6 on the surface of the semiconductor body 2. In a corresponding manner, the connecting pad 21 on the housing 2a is connected via a second bonding wire B to the connecting contact 7 on the surface of the semiconductor body. The parallel, physically close, arrangement of the two bonding wires B' and B illustrated here leads to inductive coupling and capacitive coupling. The bandpass/bandstop filter illustrated in FIG. 4 can be produced by a suitable geometric arrangement, for example of the length of the bonding wires B and B', of the distance from one another, and possibly of the materials used.

In this context, it is likewise possible to provide additional elements in order to improve the effect of suppression of undesirable components. Furthermore, the connecting pads on the housing 2a and the connecting contacts 6 and 7 likewise act as additional elements to produce the characteristic of the bandpass/bandstop filter. This includes, inter alia, capacitive effects resulting from the materials used and their physical extent on the surface of the semiconductor body 2 and of the housing 2a.

In addition to the two connecting contacts 6 and 7, the semiconductor body 2 has further connecting contacts 61 to 65. These are connected to corresponding connecting pads 22 to 26 via additional bonding wires B1 to B5. During operation of the integrated circuit in the semiconductor body 2, various signals are supplied to the connecting pads 22 to 26. These are a supply voltage and/or a supply current of the connecting pads 22 and 26. Furthermore, controls signals are supplied to the integrated circuit in the semiconductor body 2 at the connecting pad 23 via the bonding wire B4. Demodulated signals from the receiving amplifier are tapped off via the connecting pads 24 and 25.

Figure 6:
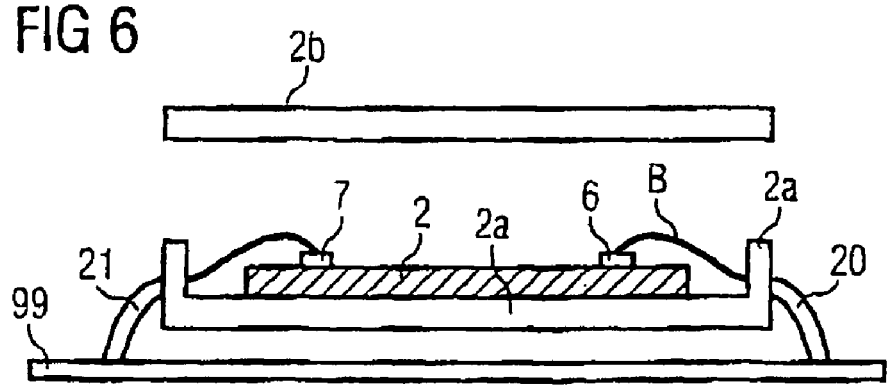
FIG. 6 is a sectional side view illustrating the fourth exemplary embodiment, in a housing.

FIG. 6 shows a side view of the housing with the integrated semiconductor body. In this embodiment, the housing 2a can be closed by a cover 2b. The semiconductor body 2 is arranged within the housing, with a cutout. The connecting points 6 and 7 on the surface of the semiconductor body are connected via the bonding wires B to the corresponding connecting pads 20 and 21, respectively. The respective connecting pads 20 and 21 are themselves connected to the coils $L_1$, $L_1$', which are not illustrated here.

The coils $L_1$, and $L_1'$ as well as the coil Lp are denoted by an inductance. In this case, the coils may advantageously be, for example, in the form of simple metallic lines. This is particularly expedient when the required inductance to produce the tuned circuit is only very small, for example in the region of a few nanohenries (nH).

Figure 5:
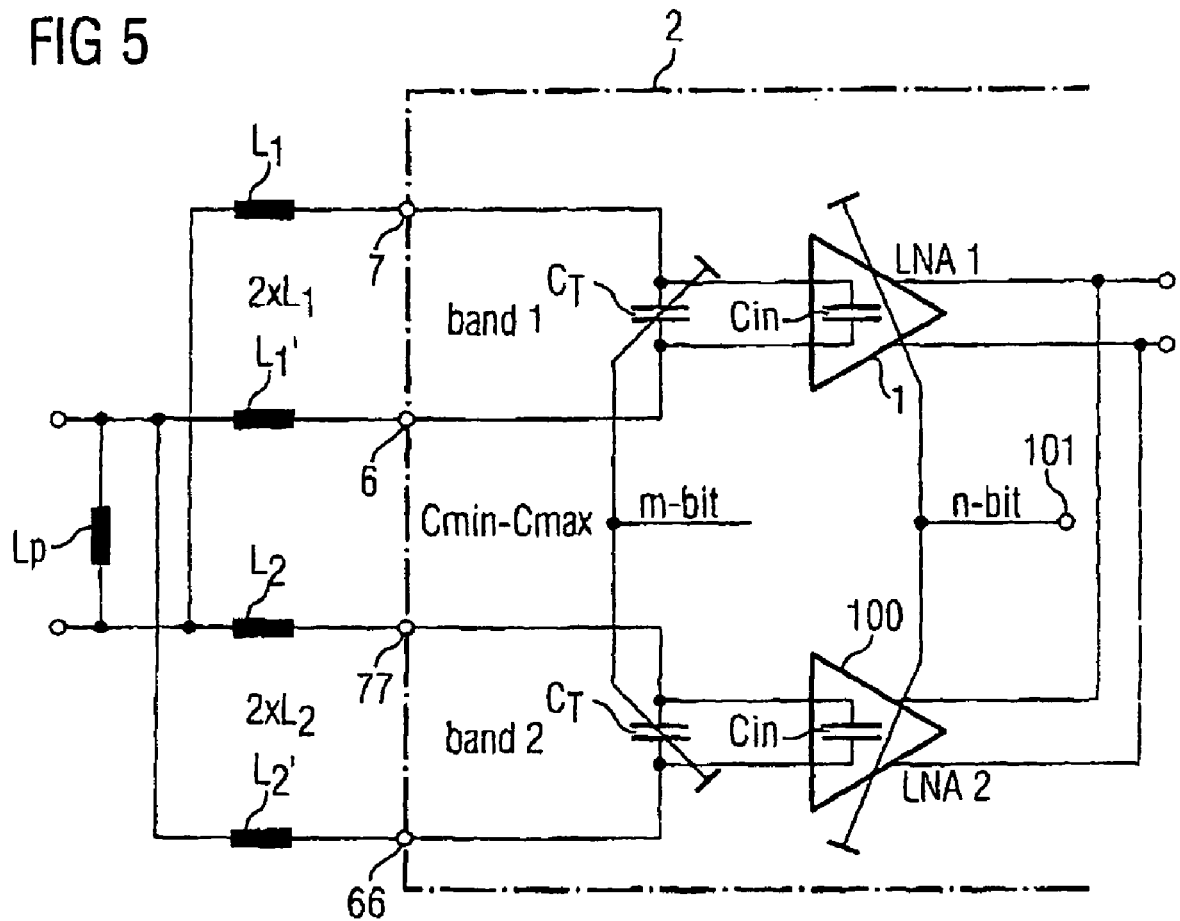
FIG. 5 is a schematic diagram illustrating a fifth exemplary embodiment of the invention.

FIG. 5 shows another embodiment of the receiving amplifier according to the invention. In this embodiment, a plurality of integrated receiving amplifiers 1, 100 are implemented in the semiconductor body 2 and each have a control input 101 for supplying an n-bit control signal. The n-bit control signal is used to set discrete values of a gain factor in the two low-noise amplifiers 1 and 100. The gain can be selected in a suitable manner as a function of the field strength or power of a signal which is applied to the input side, such that the amplifier does not produce any distortion, while nevertheless providing optimum gain. Furthermore, the two amplifiers 1, 100 are optimized for amplification in different frequency ranges. One of the two signal paths is selected depending on the frequency of the received signal to be amplified.

For this purpose, each of the two receiving amplifiers 1, 100 has its own associated tunable tuning circuit, which in each case have variable-capacitance elements $C_T$, which are themselves connected via connecting contacts on the surface of the semiconductor body to coils. The various inductances of the coils $L_1$, $L_1'$ and $L_2$, $L_2'$ together with the variable capacitances $C_T$ result in the two tuned circuits having different resonant frequencies. In this exemplary illustration, the capacitances of the elements $C_T$ are chosen to be of the same magnitude. The different resonant frequencies of the two tuned circuits in the signals paths are produced by the different inductances of the coils. It is likewise possible for the capacitances of the elements $C_T$ to differ.

The connection of the two tuned circuits band 1 and band 2 in parallel together with the low-noise amplifiers 1 and 100 connected to them results in a considerably wider frequency adjustment range for the receiving amplifier. At the same time, each individual low-noise amplifier 1, 100 can be further optimized for its respective narrow frequency range. Nevertheless, the adjustment of the capacitive element $C_T$ allows sufficiently good matching and thus a voltage increase for a better signal-to-noise ratio.

Figure 8A:
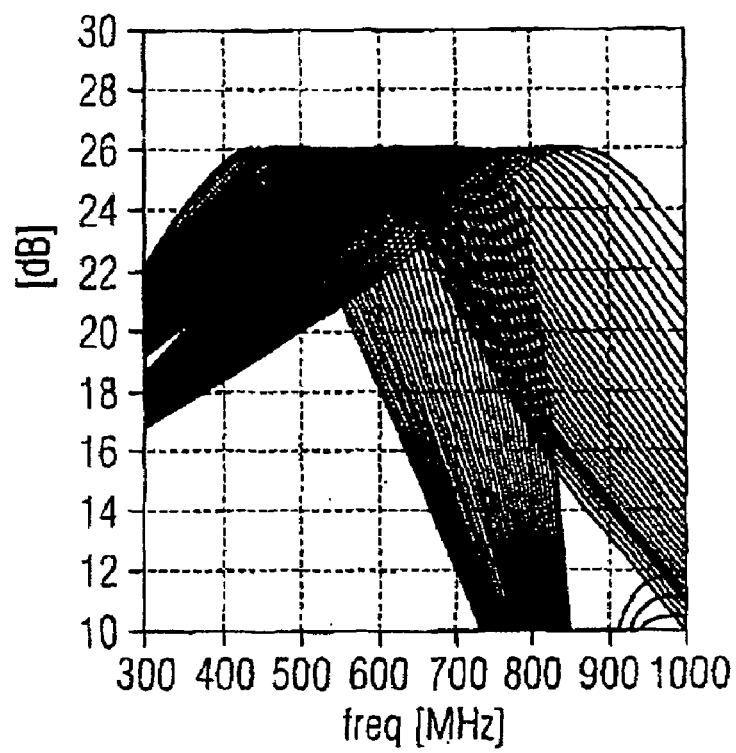
Figure 8B:
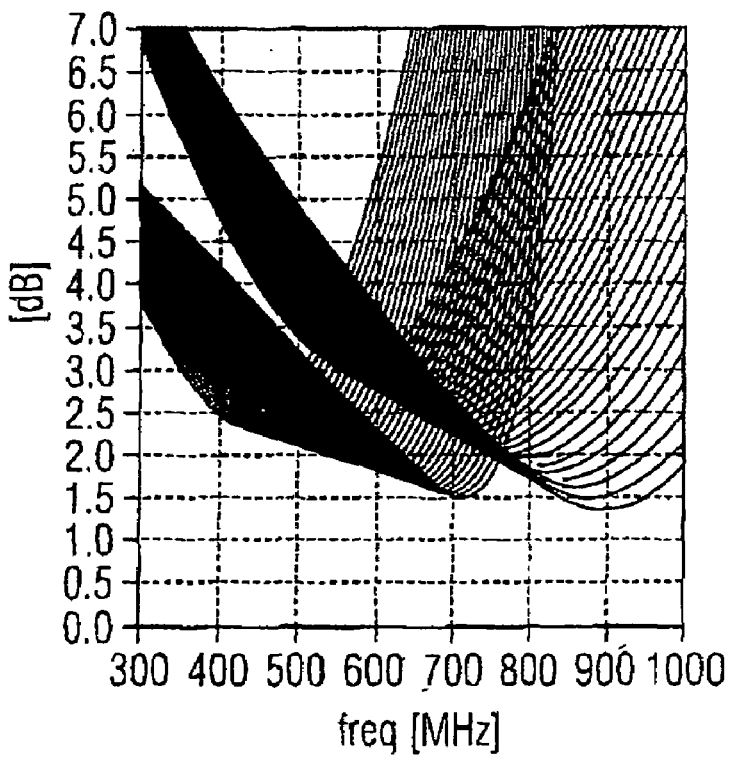

FIGS. 8A and 8B show two graphs relating to this feature. FIG. 8A shows the frequency response of the receiving amplifier illustrated in FIG. 5 over the frequency range from 300 MHz to 1 GHz. Essentially, two different families of curves can be seen. Each of the families of curves contains a large number of individual curves. The curves in each family of curves show the frequency response of the respective tuned circuit with the downstream amplifier for the various capacitance settings of the element $C_T$. The optimum frequency response is in the region of 26 dB. Depending on the desired frequency to be received, one of the two signal paths is activated, and the variable-capacitance element $C_T$ is adjusted so as to achieve the optimum frequency response.

In addition, major suppression can be seen at about 870 MHz, which is produced by a bandstop filter provided by bonding wires or other connecting means such as solder balls or bumps.

FIG. 8B shows the noise factor of the receiving amplifier as a function of the frequency for a frequency range from 300 MHz to 1 GHz for the two signal paths in the exemplary embodiment shown in FIG. 5. Once again, this shows that the noise factor of the receiving amplifier is minimized at the corresponding resonant frequency of the tuned circuit, selected by means of the capacitive element $C_T$.

The noise factor of the receiving amplifier can be minimized over a wide frequency range by appropriate selection of the variable capacitive elements. At the same time, the sensitivity for a received signal is greatly improved. This is achieved inter alia by suitable matching of the input impedance of the amplifier circuit that is integrated in the semiconductor body, by means of the upstream tuned circuit.

In this case, the amplifier circuit in the semiconductor body can be formed entirely using complementary MOS technology, or at least using field-effect transistor technology. This allows the input signals to be processed without any current flowing, thus reducing the current load on the capacitors and on the variable capacitive elements. A small or negligible current load in the tuned circuit improves the resonance behavior, and results in a very good signal-to-noise ratio, and thus in the receiving amplifier having a sufficiently good noise factor. At the same time, the bandpass characteristic of the tuned circuit ensures adequate suppression of undesirable signal components outside the resonant frequency range, and thus outside the useful signal range. The tracking capability thus makes it possible to improve the performance of the low-noise amplifier over a wide frequency range.

The receiving amplifier is particularly suitable for use in communication standards whose signals are transmitted over a wide frequency range. Examples of this are the DVB-T and DVB-S digital television standards, as well as broadband mobile radio standards such as WLAN in the 2.4 and 5.2 GHz bands. A further application option is for wire-based communication systems in the low-frequency range, in particular for "DSL" (digital subscriber line). The individual applications and the illustrated embodiments can be combined as required.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best.

The invention claimed is:

1. A receiving amplifier, comprising:
a first input connection;
a semiconductor body comprising a first node and a second node;
an amplifier circuit integrated in the semiconductor body and comprising at least one transistor, a first input, a second input, and a capacitive element arranged between the first and the second input; and
a tuned circuit configured to generate a tunable resonant frequency, comprising:
a variable-capacitance element integrated in the semiconductor body, comprising a control input connected between the first and the second nodes and in parallel with the capacitive element of the integrated amplifier circuit; and at least one first inductive element coupled between the first node and the first input connection.

2. The receiving amplifier of claim 1, further comprising:
a second input connection; and
a second inductive element coupled between the second node and the second input connection.

3. The receiving amplifier of claim 2, further comprising a third inductive element coupled between the first input connection and the second input connection.

4. The receiving amplifier of claim 1, wherein the at least one transistor in the amplifier circuit is integrated in the semiconductor body and comprises a field-effect transistor.

5. The receiving amplifier of claim 1, wherein the first node forms a first contact point and the second node forms a second contact point on a surface of the semiconductor body.

6. The receiving amplifier of claim 1, wherein the at least one first inductive element is arranged outside the semiconductor body.

7. The receiving amplifier of claim 1, wherein the variable-capacitance element comprises a plurality of charge storage devices arranged in parallel, and selectively coupled between the first and second nodes via a switching apparatus controlled by a signal at the control input.

8. The receiving amplifier of claim 7, wherein the capacitance of each of the plurality of charge storage devices is the same magnitude.

9. The receiving amplifier of claim 7, wherein the capacitances of at least two of the plurality of charge storage devices differ by a factor of 2.

10. The receiving amplifier of claim 1, wherein the variable-capacitance element comprises a varactor diode having a variable capacitance.

11. The receiving amplifier of claim 1, wherein the amplifier circuit comprises a differential amplifier comprising a first field-effect transistor and a second field-effect transistor, wherein gate connections of the first and second transistors form the first and the second inputs of the amplifier circuit, respectively.

12. The receiving amplifier of claim 11, wherein the capacitive element in the amplifier circuit comprises a gate-drain capacitance of the first and second field-effect transistors, or a gate-source capacitance of the first and second field-effect transistors.

13. The receiving amplifier of claim 5, further comprising:
a housing surrounding the semiconductor body and comprising connecting pads;
connecting means for coupling the connecting pads of the housing to the connecting contacts on the surface of the semiconductor body, wherein the connecting means comprises a bandstop filter characteristic.

14. The receiving amplifier of claim 13, wherein the connecting means comprises bonding wires.

* * * * *